United States Patent [19]

Nussbaumer

[11] 3,959,637
[45] May 25, 1976

[54] DIGITAL FILTER
[75] Inventor: Henri J. Nussbaumer, La Gaude, France
[73] Assignee: International Business Machines Corporation, Armonk, N.Y.
[22] Filed: Mar. 17, 1975
[21] Appl. No.: 558,972

[30] Foreign Application Priority Data
June 21, 1974 France .............................. 74.22172

[52] U.S. Cl. .............................. 235/152; 325/38 B; 328/167; 333/18
[51] Int. Cl.² ...................... G06F 1/02; G06F 15/34
[58] Field of Search ........... 235/152, 156; 325/38 B; 333/18, 70 T; 328/167

[56] References Cited
UNITED STATES PATENTS

| | | | |
|---|---|---|---|
| 3,633,105 | 4/1972 | Lender et al. ..................... | 333/18 X |
| 3,633,170 | 1/1972 | Jones, Jr. ...................... | 333/70 T X |
| 3,639,848 | 2/1972 | Elliott ............................... | 328/167 |
| 3,699,321 | 10/1972 | Gibson ............................... | 235/152 |
| 3,777,130 | 12/1973 | Croisier et al. ..................... | 235/152 |
| 3,794,816 | 2/1974 | Esteban .............................. | 235/152 |
| 3,822,404 | 7/1974 | Croisier et al..................... | 325/38 B |

Primary Examiner—Malcolm A. Morrison
Assistant Examiner—Jerry Smith
Attorney, Agent, or Firm—Delbert C. Thomas

[57] ABSTRACT

A digital filter for a plural digitally expressed pulse code modulated (PCM) signal utilizes a storage register to retain several samples of the signal and obviates the need for digital multiplication circuits by using a delta coding for the filter coefficients. Processing steps are at a multiple of the sampling rate and at each step, the value of one stored sample is combined additively or subtractively with previously stored sample values as determined by stored delta coefficient values. The summed values are periodically transmitted as output samples of a filtered PCM signal.

3 Claims, 4 Drawing Figures

DIGITAL FILTER

GENERAL DESCRIPTION AND OBJECTS

This invention relates to a type of digital filter wherein the filter coefficients needed to provide the desired impulse response are delta coded.

When a signal $x(t)$ passes through a filter having an impulse response $h(t)$, an output signal $y(t)$ is obtained, which is the result of a convolution operation defined by the following expression:

$$y(t) = \int_{\tau=0}^{t} h(\tau) \cdot x(t-\tau) \, d\tau. \qquad (1)$$

where $\tau$ is an integration variable.

An approximate value of signal $y(t)$ can be derived from expression (1) by sampling functions $h(t)$ and $x(t)$ at regular intervals, for example every T seconds. Expression (1) then becomes:

$$y(t) \sim \sum_{N=0}^{N=t/T} h(NT) \cdot x(t-NT) \qquad (2)$$

this value of $y(t)$ being within one attenuation coefficient $1/T$ of the correct value.

It will be seen that while expression (1) enables a determination of the value of $y(t)$ at any time, expression (2) can only be used to provide a discontinuous series of the values of the signal, that is, the values of the function of $y(t)$ taken at regular intervals such as T. Accordingly, if we call $h_0, h_1, h_2 \ldots h_n$ the values of $h(NT)$ for $N = 0, 1, 2, \ldots t/T$ we may state that the value of the sample of $y$ at any instant $t_0$ satisfies the expression:

$$y_{(t_0)} = h_0 \cdot x_{(t_0)} + h_1 \cdot x_{(t_0-T)} + h_2 \cdot x_{(t_0-2T)} + \ldots + h_n \cdot x_{(t_0-nT)} \qquad (3)$$

The values $h_0, h_1, \ldots h_n$ are the coefficients of the impulse response of the filter and $x_{(t_0)}, x_{(t_0-T)}, \ldots, x_{(t_0-nT)}$ represent the value of the samples of the signal to be filtered at instants $t_0, t_0-T, \ldots t_0-nT$.

A digital filter can therefore be defined as a device which determines the values of samples of the output signal $y(t)$ by weighting $n+1$ successive samples of the input signal $x(t)$, using weighting coefficients which are determined by sampling the desired impulse response at the sampling times, and by accumulating the results so obtained.

In order that the advantages of the present invention may be more fully set out, the effects of the sampling process are briefly discussed hereafter. The sampling theorem shows that such a process results in a modification of the frequency spectrum of the signal being sampled. The spectrum of the original signal is found, subsequent to sampling, above and below both the fundamental and each of the harmonics of the sampling frequency. Accordingly, unless suitable precautions are taken, the various appearances of this spectrum may interfere with each other, thereby altering the output signal. In other words, the original signal would not be recovered at the output of the sampler. Since the signal obtained at the filter output consists of samples, its spectrum will have a comb-like form. To convert this signal to a continuous analog form, it is theoretically sufficient to cause it to pass through a low-pass filter, the cost of the filter being a function of the degree of precision required. If the lobes of the spectrum of the signal which is applied to the low-pass filter are sufficiently spaced from each other, the low-pass filter can be of a very simple type. This shows that the higher the signal sampling frequency, the easier is the final conversion of the signal to a filtered analog form. Since the convolution operation in the time domain (expression (1) above) leads to a product in the frequency domain, if the spectrum of at least one of the sampled terms $h(t)$ or $x(t)$ comprises widely spaced lobes, so will the spectrum of the sampled output signal $y(t)$, and this will facilitate its conversion to an analog form.

One of the features of the well-known delta coding scheme is that it involves the use of a high sampling frequency. This type of coding is therefore particularly attractive from the standpoint of digital filtering. Many descriptions of such filters are available in the prior art. Reference is made in this connection to French Pat. No. 70 40291 filed on Oct. 29, 1970 by the same assignee and entitled: "Filtre digital d'une Information en code delta" corresponding to U.S. Pat. No. 3,822,404, issued July 2, 1974 to Alain Crosier et al. and to a paper entitled "A New Approach to the Realization of non-Recursive Digital Filters" by Abraham Peled and Bede Liu in the IEEE Transactions on Audio and Electroacoustics, Vol. AU21, No. 6, December 1973. In both of these references, the input signal $x(t)$ is in a delta coded form while the filter coefficients are binarily or PCM coded. In addition to the advantages mentioned above, the use of the delta coding scheme entails a simplification of the mathematical operations required to evaluate expression (3) since the values of the samples of $x(t)$ can only be equal to +1 or −1. Also, the fact that the output signal is obtained at the high delta sampling frequency results in that signal being quasi-continuous and better defined. However, this concept of filtering a delta modulated signal presents some disadvantages. When several operations, some of which require operations on samples of the signal in its binary coding scheme, are to be sequentially performed on signal $x(t)$, such operations may not take place before the signal reaches the filter or after it has left the filter unless intermediate recoding operations are carried out to convert the signal from delta to PCM modulation. In a signal processing system, such disadvantages may outweigh the above-mentioned advantages of the delta filtering method.

It is then the object of the present invention to provide a digital filter which allows the use of a PCM coded input signal $x(t)$ while retaining the advantages of the delta filtering scheme.

The foregoing and other objects, features and advantages of the invention will be apparent from the following more particular description of a preferred embodiment of the invention, as illustrated in the accompanying drawings.

DRAWINGS

Figure 1:
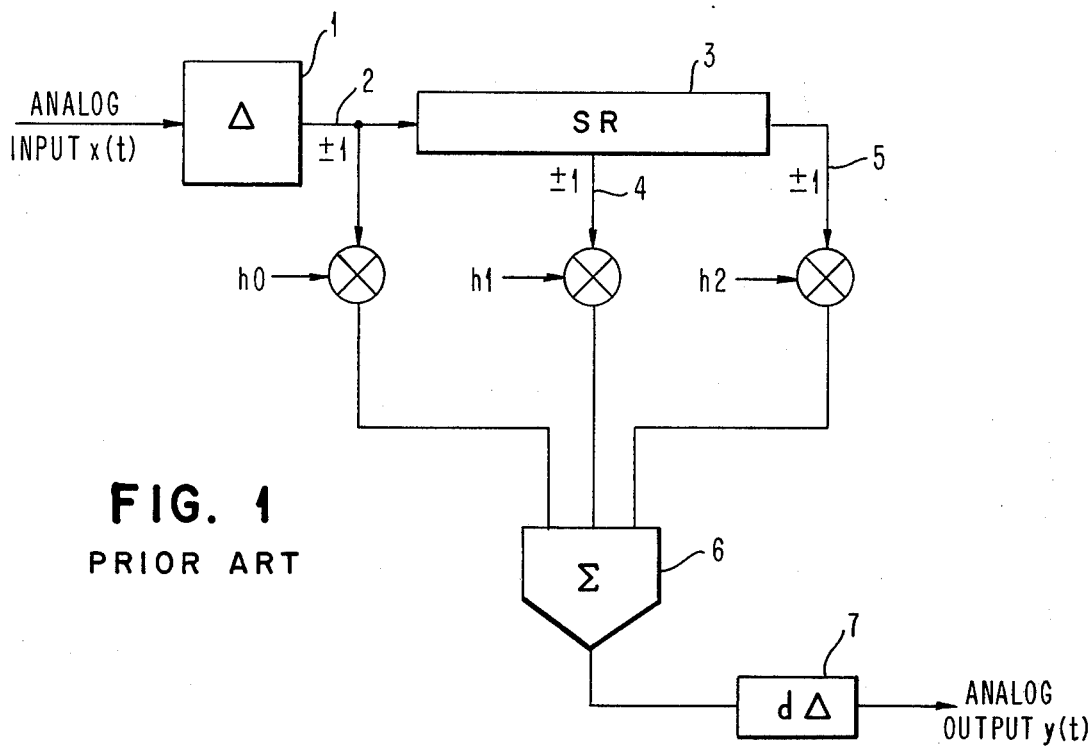
FIG. 1 is a schematic drawing of a prior art filter.

In all prior art implementations of a digital filter using the delta coding scheme, the computation of the value of each output signal sample $y(t)$ has always amounted to solving Eq. (3) above wherein the input signal $x(t)$ is delta coded. With this coding, the values of input samples $$x_{(t_0)}, x_{(t_0-T)}, \ldots, x_{(t_0-nT)}$$

can only be equal to +1 or −1. However, the values of $h_0, h_1, \ldots, h_n$ are determined by using the binary PCM coding scheme and each value comprises several bits. FIG. 1 illustrates the principle of this operation for $n=2$. The analog input signal $x(t)$ is delta coded in coder 1 and the samples thus obtained on line 2 are applied to a shift register 3 designed to provide at its outputs 4 and 5, the delta values for samples $x(t-T)$ and $x(t-2T)$. Each of the samples on lines 2, 4 and 5, the value of which is equal to either +1 or −1, is then multiplied by a filter coefficient of value $h_0=a_1$, $h_1=a_2$ or $h_2=a_3$. The results of these operations are algebraically added together in an adder 6 to provide a sample of output signal $y(t)$. Since the coefficients are PCM coded, the output samples is coded in differential PCM ($\Delta$PCM). Its conversion to analog form requires a decoding operation performed in decoder 7. Since signal $x(t)$ is not PCM coded at the input and signal $y(t)$ is not PCM coded at the output of the filter, these signals can undergo no operation involving the use of such a code unless intermediate recoding operations are performed.

In the present invention, any one of a series of PCM operations associated with a complex processing of signal $x(t)$ can be performed before the signal is applied to the filter, while retaining the advantages of delta filtering.

Figure 2:
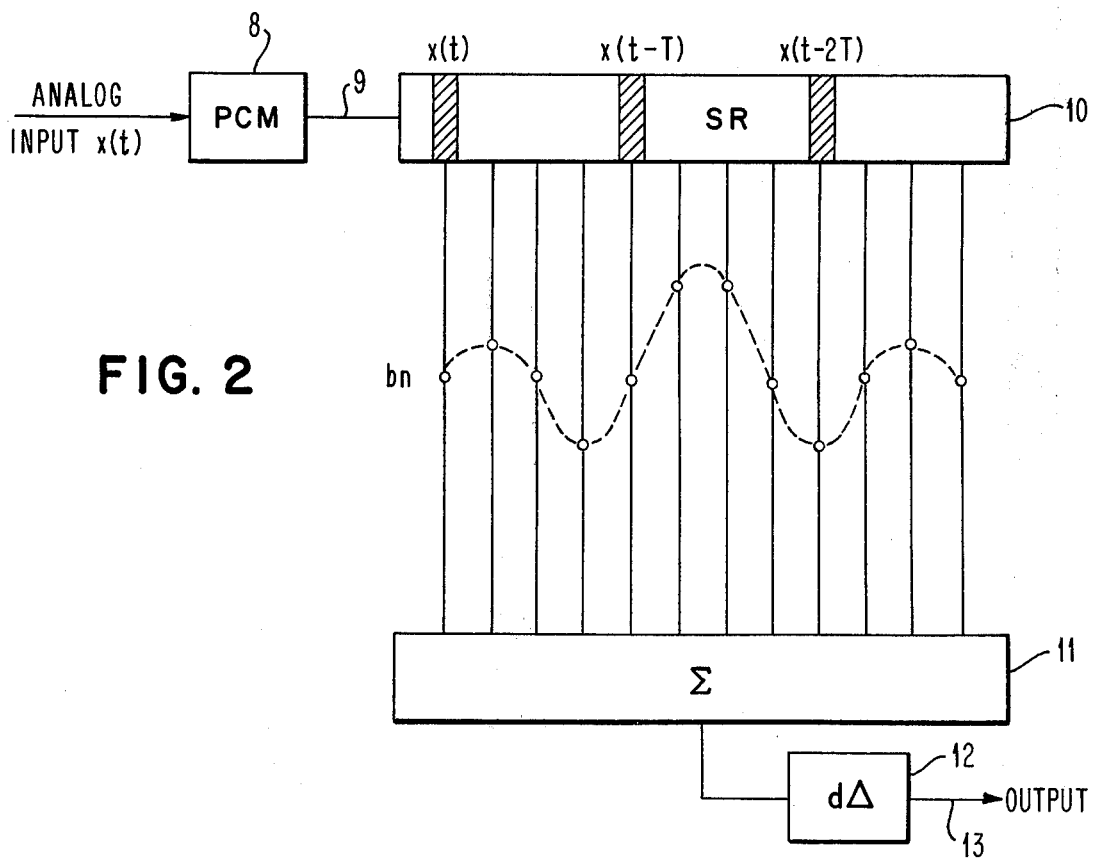
FIG. 2 is a schematic diagram illustrating a digital filter realized in accordance with the invention.

FIG. 2 illustrates in schematic form the method of the invention. As shown, an input analog signal $x(t)$ is given any needed processing and is PCM coded in coder 8 and its samples each in the form of a sequence of binary signals, are then applied over line 9 to a tapped shift register 10 which holds the samples for weighting with the filter coefficients. The latter are obtained by means of a differential or delta coding of the desired impulse response $h(t)$ of the filter. Since expression (1) is commutative, the operations performed on $x(t)$ can just as well be performed on $h(t)$. The coefficient terms can therefore be coded using the differential PCM ($\Delta$PCM) coding scheme, instead of such a coding of signal $x(t)$, without the result of the filtering operation being modified as a result thereof. It should be noted that, in this coding scheme, several bits (PCM) may still be used to represent the signal amplitude. However, if a 1-bit code ($\Delta$code) is used, it becomes possible to simplify the weighting process, although a much larger number of coefficients must be used to properly define the filter than in the example of FIG. 1. The weighted samples are to be added together in adder 11 to provide the required $\Delta$PCM coded samples of $y(t)$. These output samples of adder 11 are then decoded in decoder 12 to provide the filtered analog signal on line 13.

Despite these advantages, the differential mode of coding illustrated in FIG. 2 may be considered impractical since a filter requiring, say, ten taps in an all-PCM approach, or even in a conventional delta approach as above mentioned, would now require as much as ten times as many. In addition, shift register 10 would have to be up to ten times larger than in either of the other approaches.

This difficulty can be somewhat overcome by taking advantage of the fact that the PCM or delta coded samples are stored in the shift register 10 at regular intervals related to the sampling rate T. Accordingly, in order for the device of FIG. 2 to have the same capabilities as that of FIG. 1, no more than three PCM coded samples of $x(t)$ need be shifting through shift register 10 at any one time. Since each of these samples will pass several taps during a sampling interval, both the number of taps used for weighting and the length of the shift register can be substantially reduced.

Assuming, for example, that the selected sampling and weighting rate using the delta coding scheme is four times higher than the rate at which the samples are received at the input 9 of the filter, twelve coefficients, $b_1$–$b_{12}$, would be required. In other words, the filtered output signal samples $y(t)$ to be generated between instants t and t+T must satisfy the following expressions:

$$y_1(t) = b_1 x_{(t)} + b_5 x_{(t-T)} + b_9 x_{(t-2T)}$$
$$y_2(t) = b_2 x_{(t)} + b_6 x_{(t-T)} + b_{10} x_{(t-2T)}$$
$$y_3(t) = b_3 x_{(t)} + b_7 x_{(t-T)} + b_{11} x_{(t-2T)}$$
$$y_4(t) = b_4 x_{(t)} + b_8 x_{(t-T)} + b_{12} x_{(t-2T)} \quad (4)$$

The next samples to be generated, i.e. in the interval from $t+T$ to $t+2T$, must be:

$$y_1(t+T) = b_1 x_{(t+T)} + b_5 x_{(t)} + b_9 x_{(t+T)}$$
$$y_2(t+T) = b_2 x_{(t+T)} + b_6 x_{(t)} + b_{10} x_{(t+T)}$$
$$y_3(t+T) = b_3 x_{(t+T)} + b_7 x_{(t)} + b_{11} x_{(t+T)}$$
$$y_4(t+T) = b_4 x_{(t+T)} + b_8 x_{(t)} + b_{12} x_{(t+T)}$$

The samples of x can therefore be weighted in groups of three, provided the weighting operations are performed four times before a new PCM coded sample is received at the input 9 of the filter. Thus, the above-mentioned disadvantagees of the invention can be overcome by repeating the weighting operations several times between two consecutive occurrences of data at the input of the filter. A device realized in accordance with the diagram of FIG. 3 may be used to this end.

Figure 3:
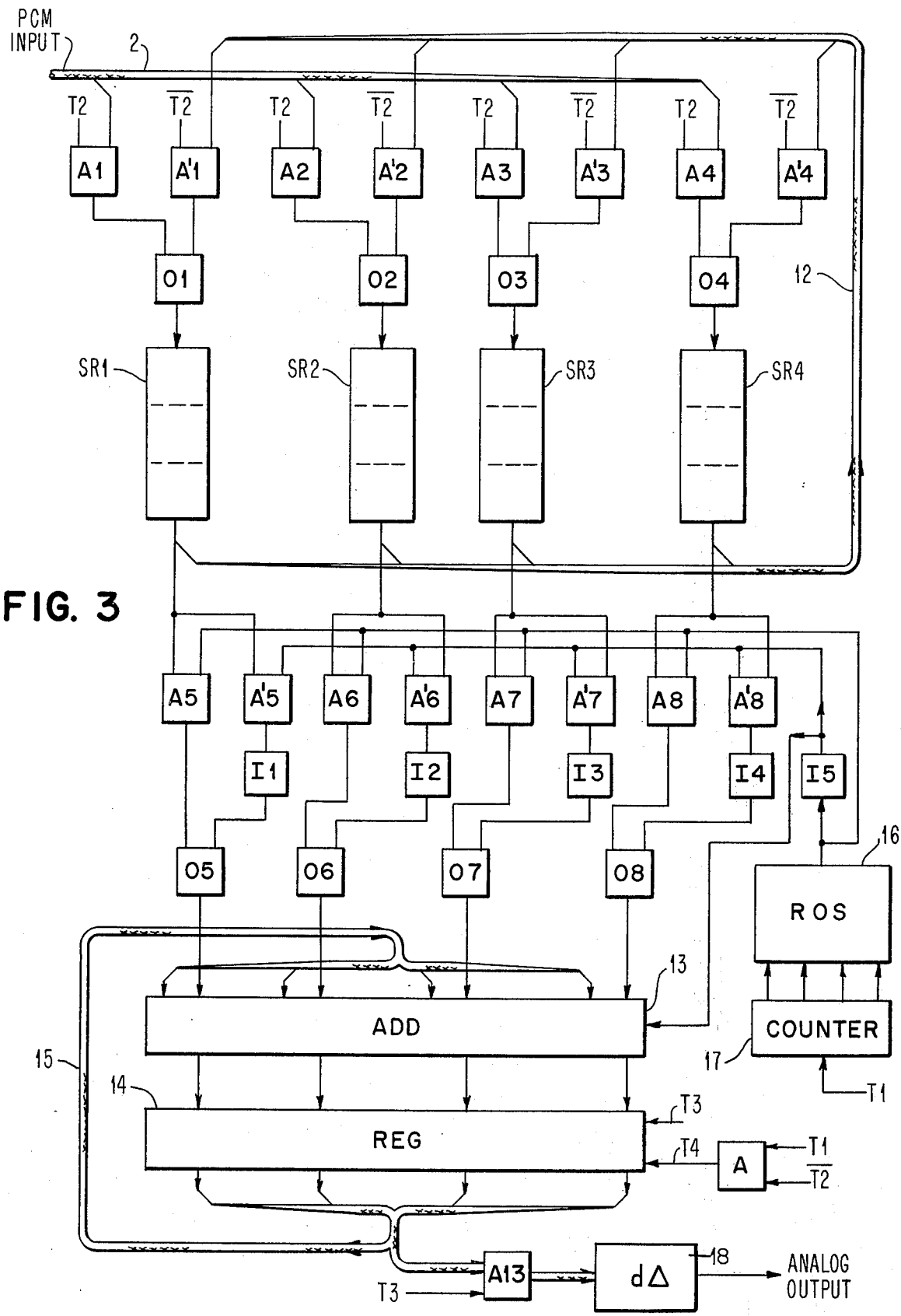
FIG. 3 illustrates an embodiment of the invention.

As shown in FIG. 3, the filter input lines 2 are connected to a set of AND gates A1 to A4 which open when a control signal T2 is present during the time a sample value is present at input 9. The output of each of these gates is connected to the inputs of a set of four shift registers SR1 to SR4 with three bit positions each, through an associated one of four OR circuits 01 to 04. The output bits from each of these registers is sent back over a bus 12 to the input thereof through one of four AND gates A'1 to A'4 which are opened when T2 is not present, i.e. at all times except when a new input sample is being entered into the shift registers, and the output is simultaneously applied to a corresponding pair of four pairs of AND gates A5 to A8 and A'5 to A'8. The outputs of each of these pairs of AND gates are respectively applied to the inputs of one of four OR circuits O5 to O8, either directly from gates A5 to A8 or from gates A'5 to A'8 through one of the inverters I1 to I4, associated therewith. The outputs of OR O5 to O8 are in turn applied to one set of inputs of an accumulator which includes an adder 13 and a register 14, the output of which is fed back over a bus 15 to the other inputs of the adder 13. The arrangement further includes one bit wide read-only storage 16, the output of which is directly connected to the control inputs of AND gates A5 to A8 and is connected through an inverter I5 to the control inputs of AND gates A'5 to A'8. The output of I5 is also connected to one of the inputs of the low order of adder 13. A modulo 13 counter 17 is provided to address the storage 16 containing coefficients $b1$ to $b12$ which are equal to $\pm 1$ and are stored at consecutive addresses in accordance with the sequence $b_9, b_5, b_1, b_{10}, b_6, b_2, b_{11}, b_7, b_3, b_{12}, b_8, b_4$. The last counter position (13) does not correspond to a valid address but is needed for timing and shifting purposes only.

Figure 4:
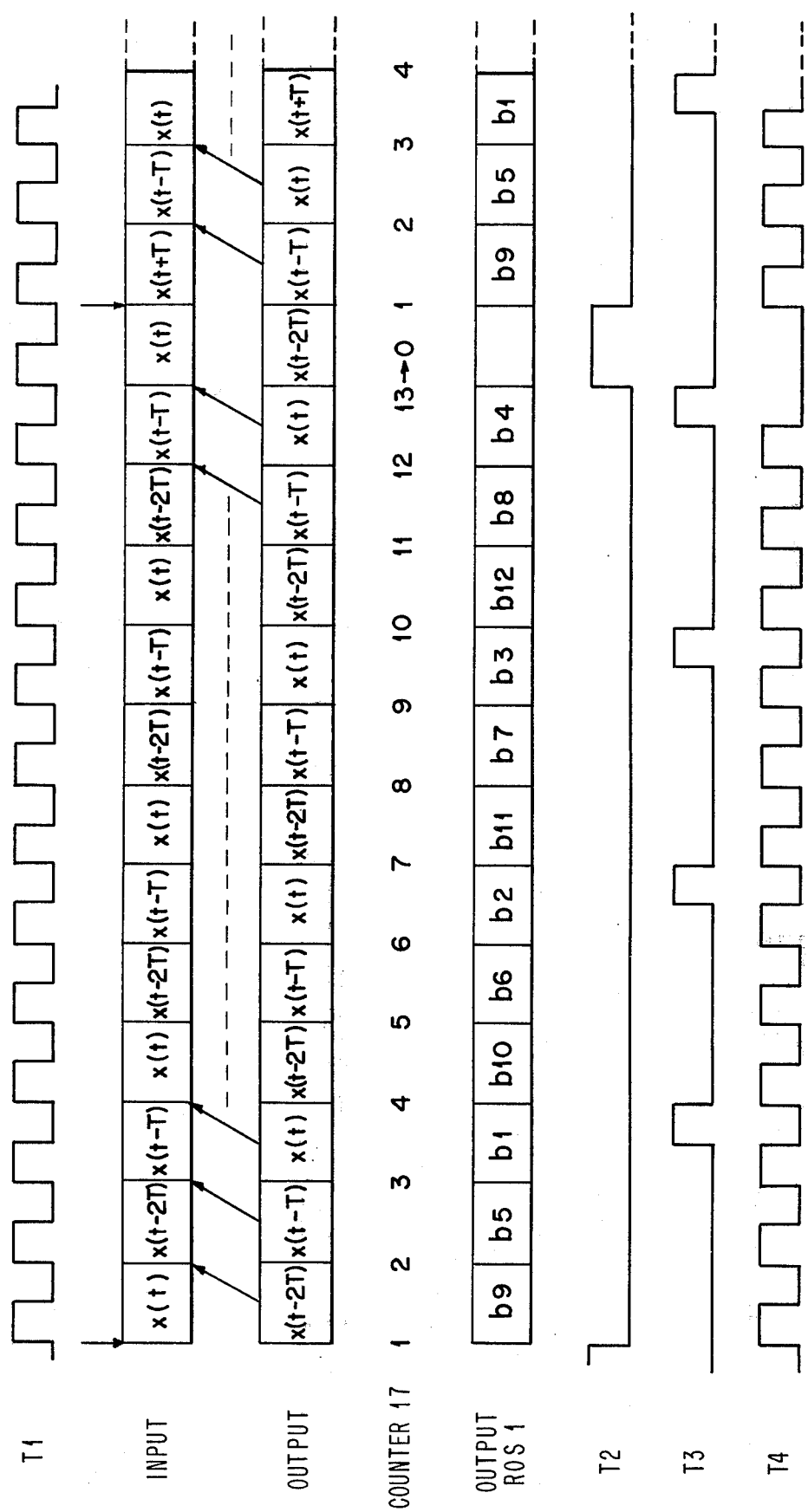
FIG. 4 is a graph illustrating the time relationships between the signals of the filter.

At the instant the generation of sample $y(t)$ of expression (4) begins, see also the timing diagram of FIG. 4, those positions of registers SR1 to SR4 which are closest to the inputs contain the bits of the value of the input sample $x(t)$. The other positions contain the bits of the values of samples $x_{(t-T)}$ in the middle position and $x_{t-2T}$ in the bottom position. The first rise of shift pulse T1, counter 17 =0, causes the bits of word $x_{(t-2T)}$ to be shifted out to the inputs of the pairs of AND gates A5 to A8 and A'5 to A'8. Shift pulse T1 has also incremented the count value in counter 17 to 1 and the coefficient $b_9$ is read out of storage. If the value of the coefficient being read is equal to +1, AND gates A5 to A8 are opened and the value of word $x_{(t-2T)}$ is fed to added 13 of the accumulator. If the coefficient $b_9$ is equal to −1, then $x_{(t-2T)}$ must be inverted. It will first be noted that the output of inverter I5 controls AND gates A'5 to A'8 to open, resulting, because of the presence of inverters I1 to I4, in the entry of the complements of the bits of signal $x_{(t-2T)}$ being fed to the adder 13 of the accumulator. This, however, will not suffice to cause the value $x_{(t-2T)}$ to be completely inverted when the PCM samples of input signal $x(t)$ are coded using the so-called two's complement code. A value of +1 must be added to the bits which have been inverted to complete the required value inversion. A free low order input of adder 13 is used for this entry. The output of inverter I5 is connected to the carry input of the stage thereof that processes the lowest order bit. The computed word $b_9 \cdot x_{(t-2T)}$ passes through the adder unchanged and is stored in register 14 under control of a timing signal T4 determined as the AND function of signals T1 and T2 as indicated on the bottom line of FIG. 4. While it was applied to the couples of gates A5 to A8 and A'5 to A'8, the word $x_{(t-2T)}$ was also returned over a bus 12 to the set of AND gates A'1 to A'4 on the inputs of shift registers SR1 to SR4 and, since T2 was then equal to zero, was again stored therein. The contents of the shift registers SR1 to SR4 are now, from the input to the output of the registers, $x_{(t-2T)}, x_{(t)}$ and $x_{(t-T)}$.

When the next T1 pulse occurs, $x_{(t-T)}$ is simultaneously applied to the inputs of said pairs of gates A5 to A8 and A'5 to A'8 and to the recirculation loop 12 of the registers SR1 to SR4. Since T2 is still down, $x_{(t-T)}$ is stored in the shift registers again, with T1 causing the contents to be shifted. At the same time, the count value of counter 17 is incremented by T1, so that coefficient $b_5$ is read out of ROS 16, and the term $b_5 \cdot x_{(t-T)}$ computed as before is applied to the input of addr ADD together with the value already in register 14, namely $b_9 \cdot x_{(t-2T)}$. The adder 13 performs the operation $b_9 \cdot x_{(t-2T)} + b_5 \cdot x_{(t-T)}$ and signal T4 then stores the result in register 14. At the next T1 pulse, $b_1 \cdot x_{(t)}$ is calculated and added to the previous result from register 14. After this addition and entry of the value into register 14, the increment $y_1(t)$ of the $\Delta$PCM coded output signal is present in register 14. This increment is sent through AND gate A13 which is opened by the signal T3 and register 14 is reset when the T3 signal falls to its low level. This shows that the output signal $y(t)$ is obtained at a sampling rate higher than 1/T (in this example, four times higher). The above process is repeated three more times to obtain all increments $y_1(t), y_2(t), y_3(t),$ and $y_4(t)$ in four circulations, i.e.:

$$y_1(t) = b_9 \cdot x_{(t-2T)} + b_5 \cdot x_{(t-T)} + b_1 \cdot x_{(t)} \quad (a)$$

$$y_2(t) = b_{10} \cdot x_{(t-2T)} + b_6 \cdot x_{(t-T)} + b_2 \cdot x_{(t)} \quad (b)$$

$$y_3(t) = b_{11} \cdot x_{(t-2T)} + b_7 \cdot x_{(t-T)} + b_3 \cdot x_{(t)} \quad (c)$$

$$y_4(t) = b_{12} \cdot x_{(t-2T)} + b_8 \cdot x_{(t-T)} + b_4 \cdot x_{(t)} \quad (d)$$

A $d\Delta$ decoder 18 is provided at the output of the filter to convert the $\Delta$PCM coded signals $y_1(t)$ to $y_4(t)$ to an analog form. A suitable decoder is described, for example, in a paper entitled "Delta Modulation Code for Transmission and Switching Applications" by R. R. Laane and B. I. Murphy, in the Bell System Technical Journal, pp. 1013–1031, July-August 1970.

To complete the above description, it should be stated that during the last circulation, namely $(d)$, T2 becomes positive while $B_{12} \cdot x_{(t-2T)}$ is being determined and prevents the reentry of the value $x_{(t-2T)}$ which is replaced in shift registers SR1 to SR4 by the next sample $x_{(t+T)}$ received at the input 2 of the filter as shown on the input representing line of FIG. 4. The latter sample is then shifted twice through the shift registers while $b_8 \cdot x_{(t-T)}$ and then $b_4 \cdot x_{(t)}$ are being computed, and finally appears at the output of SR3. Another T1 pulse will shift the $X_{(t+T)}$ value back to the input end of the shift registers to set the samples into the processed arrangement $x_{(t+T)}, x_{(t)}$ and $x_{(t-T)}$ to start a new cycle. During this T1 pulse, no new value is entered from adder 13 into register 14 since there is no T4 pulse and in effect, this operation is solely a shift pulse for the shift registers and counter 17. The computation of $y_{(t+T)}$ is then initiated after counter C has been reset to zero under the control of pulse T2.

While the invention has been particularly shown and described with reference to a preferred embodiment thereof, it will be understood by those skilled in the art that changes in form and detail may be made therein without departing from the spirit and scope of the invention.

What is claimed is:

1. A digital filter wherein each consecutive sample of an incoming signal is digitally coded with negative amplitudes being coded in a "two-complement" code, said filter including:

a shift register to store the values of the last n samples of said incoming signal;

a source of clock signals to shift said samples through said shift register, gates on the input of said shift register normally activated by one of said clock signals to feed back the output of said shift register to the input thereof to recirculate said stored values;

other gates on the input of said shift register activated by the complement of said one of said clock signals to feed the value of a new sample of said input signal to the input of said shift register;

an accumulator to sum up digitally coded values;
a read only storage with each storage address set to represent only a positive or a negative value corresponding to delta coding of the impulse response of said digital filter;
a clock signal driven cyclic addressing means for said read only storage to provide sequential positive or negative value signals;
gates controlled by said sequential positive or negative value signals to pass the oldest value stored in said shift register directly or complementally respectively to an input of said accumulator; and
output gates to periodically gate out the accumulated values as a filtered set of output signals.

2. A digital filter as in claim 1 in which said accumulator to sum up digitally coded values comprises:

an adder having on each of the input circuits for one factor, one of said controlled gates to pass the output of said shift register to said inputs and a second one of said controlled gates to pass said output through a bit inverter and thence to said inputs;
a storage register to receive the output of said adder;
circuits connecting the output of said storage register as a second factor input of said adder; and
an output circuit receiving selected output values from said storage register.

3. A digital filter as set out in claim 2 including:
a carry input to said adder;
an inverter activated when a negative value signal coefficient is read from said storage; and
connections from the output of said inverter to activate said carry input and said set of second gates.

* * * * *